(12) United States Patent
Wang et al.

(10) Patent No.: US 10,541,262 B2
(45) Date of Patent: Jan. 21, 2020

(54) IMAGE SENSING CHIP PACKAGING STRUCTURE AND PACKAGING METHOD

(71) Applicant: China Wafer Level CSP Co., Ltd., Suzhou, Jiangsu (CN)

(72) Inventors: Zhiqi Wang, Suzhou (CN); Zhuowei Wang, Jiangsu (CN); Guoliang Xie, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/767,121

(22) PCT Filed: Sep. 19, 2016

(86) PCT No.: PCT/CN2016/099298
§ 371 (c)(1),
(2) Date: Apr. 9, 2018

(87) PCT Pub. No.: WO2017/071426
PCT Pub. Date: May 4, 2017

(65) Prior Publication Data
US 2019/0074309 A1    Mar. 7, 2019

(30) Foreign Application Priority Data

Oct. 28, 2015 (CN) .......................... 2015 1 0712496
Oct. 28, 2015 (CN) ..................... 2015 2 0848168 U

(51) Int. Cl.
*H01L 27/146* (2006.01)
*H01L 23/00* (2006.01)

(52) U.S. Cl.
CPC ........ *H01L 27/14618* (2013.01); *H01L 24/17* (2013.01); *H01L 24/81* (2013.01);
(Continued)

(58) Field of Classification Search
CPC .................... H01L 27/14618; H01L 27/14636
See application file for complete search history.

(56) References Cited

U.S. PATENT DOCUMENTS

2009/0096051 A1* 4/2009 Sugiyama ......... H01L 27/14618
257/435
2009/0289317 A1* 11/2009 Yu .................... H01L 27/14618
257/433

(Continued)

FOREIGN PATENT DOCUMENTS

CN       101131941 A      2/2008
CN       101355066 A      1/2009

(Continued)

OTHER PUBLICATIONS

Partial translation of JP 2014-241446 (Year: 2019).*

(Continued)

*Primary Examiner* — Thomas L Dickey
(74) *Attorney, Agent, or Firm* — Wolf, Greenfield & Sacks, P.C.

(57) ABSTRACT

A package for an image sensing chip is provided, which includes: an image sensing chip comprising a first surface and a second surface opposite to each other, where the first surface is provided with an image sensing region and a contact pad; a through hole extending from the second surface to the contact pad; an electrical connection layer provided along an inner wall of the through hole and extending onto the second surface; a solder mask filling the through hole and covering the electrical connection layer, wherein an opening is formed in the solder mask, and the electrical connection layer is exposed at a bottom of the opening; a guide contact pad covering an inner wall and the bottom of the opening and extending onto the solder mask; and a solder bump located on the guide contact pad.

12 Claims, 8 Drawing Sheets

(52) U.S. Cl.
CPC .. *H01L 27/14636* (2013.01); *H01L 27/14687* (2013.01); *H01L 27/14632* (2013.01)

(56) References Cited

U.S. PATENT DOCUMENTS

2010/0321544 A1    12/2010    Matsuo et al.
2011/0175221 A1     7/2011    Ni et al.

FOREIGN PATENT DOCUMENTS

| | | |
|---|---|---|
| CN | 101814483 A | 8/2010 |
| CN | 102157462 A | 8/2011 |
| CN | 102263113 A | 11/2011 |
| CN | 105244359 A | 1/2016 |
| CN | 205159326 A | 4/2016 |
| JP | 2011-003863 A | 1/2011 |
| JP | 2014-241446 A | 12/2014 |
| WO | WO 2011/118116 A1 | 9/2011 |

OTHER PUBLICATIONS

International Search Report for Application No. PCT/CN2016/099298 dated Dec. 22, 2016.
Office Action for Japanese Application No. 2018-520498, dated Mar. 5, 2019.

\* cited by examiner

IMAGE SENSING CHIP PACKAGING STRUCTURE AND PACKAGING METHOD This application is the national phase of International Application No. PCT/CN2016/099298, titled "IMAGE SENSING CHIP PACKAGING STRUCTURE AND PACKAGING METHOD", filed on Sep. 19, 2016, which claims priority to Chinese Patent Application No. 201510712496.X, titled "IMAGE SENSING CHIP PACKAGING STRUCTURE AND PACKAGING METHOD", filed with the Chinese State Intellectual Property Office on Oct. 28, 2015, and priority to Chinese Patent Application No. 201520848168.8, titled "IMAGE SENSING CHIP PACKAGING STRUCTURE", filed with the Chinese State Intellectual Property Office on Oct. 28, 2015, all of which applications are incorporated herein by reference in their entireties.

TECHNICAL FIELD

The present disclosure relates to the technical field of semiconductors, and in particular to a package and a packaging method for an image sensing chip.

BACKGROUND

According to the current wafer level packaging technology, a whole wafer is tested and packaged, and is cut to obtain separate finished chips. The wafer level packaging technology gradually replaces the wire bonding packaging technology, and becomes the mainstream packaging technology.

Image sensors are generally packaged using the wafer level packaging technology. FIG. 1 shows a conventional package for an image sensing chip, which includes an image sensing chip 10 and a protective cover plate 20. An image sensing region 12 and a contact pad 14 are arranged on a first surface of the image sensing chip, the protective cover plate 20 is arranged above the image sensing region 12 for protecting the image sensing region. The protective cover plate 20 generally includes a glass substrate 22 and a support structure 24 on the glass substrate 22, where a cavity is formed by the support structure 24. After the support structure 24 is bonded to the first surface where the image sensing region is located, the image sensing region 12 is located in the cavity and is protected. A guide hole extending to the contact pad 14 and a solder bump 22 electrically connected with the guide hole are arranged on a second surface of the image sensing chip for external electrical connection. The guide hole includes an insulation layer 16, an electrical connection layer 18 and a solder mask 20 which are arranged in a through hole and on the second surface on two sides of the through hole. The solder bump 22 is formed on the electrical connection layer 18 on a side of the through hole, for enabling external electrical connection of the contact pad.

However, in this structure, the electrical connection layer 18 is arranged between the solder mask 20 and the insulation layer 16 which is generally made of an organic material. The solder mask 20 and the insulation layer 16 have great thermal expansion coefficients, and are subject to expansion in a subsequent reliability test due to temperature variations, by which the electrical connection layer is compressed, and is prone to defects of virtual connection or even break.

SUMMARY

In view of this, a package for an image sensing chip is provided according to a first aspect of the present disclosure to reduce defects of an electrical connection layer of the image sensing chip.

To address the above issue, a package for an image sensing chip is provided according to an embodiment of the present disclosure, which includes:

an image sensing chip including a first surface and a second surface opposite to each other, where the first surface is provided with an image sensing region and a contact pad around the image sensing region;

a through hole extending from the second surface to the contact pad;

an electrical connection layer provided along an inner wall of the through hole and extending onto the second surface, where the electrical connection layer is electrically connected with the contact pad;

a solder mask filling the through hole and covering the electrical connection layer, where an opening is formed in the solder mask, and the electrical connection layer is exposed at a bottom of the opening;

a guide contact pad covering an inner wall and the bottom of the opening and extending onto the solder mask, where the guide contact pad is electrically connected with the electrical connection layer; and a solder bump located on the guide contact pad, where the solder bump is electrically connected with the guide contact pad.

Optionally, the guide contact pad may have a circular shape.

Optionally, the package for an image sensing chip may further include a passivation layer located between the electrical connection layer and a side wall of the through hole, and on the second surface.

Optionally, the solder mask may be made of photosensitive solder mask ink.

Optionally, the package for an image sensing chip may further include: a light shielding layer located on the second surface and covering the image sensing region.

Optionally, the package for an image sensing chip may further include: a protective cover plate attached and aligned with the image sensing region of the image sensing chip, where the protective cover plate is attached and aligned with the first surface of the image sensing chip.

Optionally, the protective cover plate may be made of optical glass, where at least one surface of the optical glass is provided with an anti-reflection layer.

In addition, a packaging method for an image sensing chip is further provided according to the present disclosure, which includes:

providing a wafer including multiple image sensing chips arranged in an array, where the image sensing chip includes a first surface and a second surface opposite to each other, and the first surface of the image sensing chip is provided an image sensing region and a contact pad around the image sensing region;

forming a through hole on the second surface, where the through hole extends to the contact pad;

forming an electrical connection layer on an inner wall of the through hole and on the second surface, where the electrical connection layer is electrically connected with the contact pad;

forming a solder mask filling the through hole and covering the electrical connection layer, where an opening is formed in the solder mask, and the electrical connection layer is exposed at a bottom of the opening;

forming a guide contact pad in the opening, where the guide contact pad covers an inner wall and the bottom of the opening and extends onto the solder mask, and is electrically connected with the electrical connection layer; and forming a solder bump on the guide contact pad, where the solder bump is electrically connected with the guide contact pad.

Optionally, from the forming the solder mask to the forming the solder bump, the packaging method may further include: forming the solder mask filling the through hole and covering the electrical connection layer; forming the opening in the solder mask, where the electrical connection layer on the second surface is exposed through the opening; forming the guide contact pad on the inner wall of the opening and on the solder mask outside the opening; and forming the solder bump on the guide contact pad.

Optionally, after the forming the though hole and before the forming the electrical connection layer, the packaging method may further include: forming a passivation layer on a side wall of the through hole and on the second surface.

Optionally, the forming the passivation layer may include: depositing the passivation layer; and removing the passivation layer at a bottom of the through hole by etching.

Optionally, before the forming the through hole, the packaging method may further include: forming a light shielding layer at a position on the second surface corresponding to the image sensing region.

Optionally, the packaging method may further include: providing protective cover plates, and attaching and aligning each of the protective cover plates with the image sensing region of one of the multiple image sensing chips, where the protective cover plate is attached and aligned with the first surface of the image sensing chip.

Optionally, the protective cover plate may be optical glass, where at least one surface of the optical glass is provided with an anti-reflection layer.

In the package and the packaging method for the image sensing chip according to the embodiments of the present disclosure, the solder bump is not directly arranged on the electrical connection layer. Instead, the guide contact pad is formed between a lower surface of the solder bump and the electrical connection layer, for avoiding thermal shock to the electrical connection layer in a subsequent process for soldering the bump and other tests, thereby protecting the electrical connection layer against defects of virtual connection or even break. In addition, the guide contact pad is formed on the inner wall and the bottom of the opening of the solder mask, as well as on the surface of the solder mask outside the opening. Only the guide contact pad on the bottom of the opening is connected with the electrical connection layer, and the solder bump is electrically connected with the electrical connection layer via the guide contact pad. In this way, the guide contact pad matches with the solder bump, and the electrical connection layer does not need to be provided with an end portion matching with the solder bump at the position where the electrical connection layer is connected with the solder bump, so that the electrical connection layers can be arranged more densely, thereby greatly enhancing the degree of integration of devices, and achieving further miniaturization of the devices.

Further, the passivation layer is provided under the electrical connection layer to serve as an insulation layer for the electrical connection layer. The passivation layer has a small expansion coefficient, so that a compression force received by the electrical connection layer due to the thermal expansion is greatly reduced, thereby further reducing the defects of the electrical connection layer of the image sensing chip.

DETAILED DESCRIPTION OF THE EMBODIMENTS

In order that the objectives, features and advantages of the present disclosure can be clearer, the embodiments of the present disclosure are described in detail as follows in conjunction with the drawings.

Specific details are described in the following description so that the present disclosure can be understood completely. However, the present disclosure may also be embodied in other ways different from the way described herein, a similar extension can be made by those skilled in the art without departing from intension of the present disclosure. Therefore, the present disclosure is not limited to the specific embodiments described below.

In addition, the present disclosure is described in detail in conjunction with the schematic diagrams. When describing the embodiments of the present disclosure in detail, sectional views showing the structure of the device are not partially enlarged to a certain scale for ease of illustration. Moreover, the schematic diagrams are only examples, which should not be understood as limiting the scope of the disclosure. Furthermore, in an actual manufacture process, three-dimensioned measurements, i.e. the length, the width and the depth should be considered. Additionally, a structure in which the first feature is "on" the second feature described below may include embodiments in which the first and second features are formed in direct contact, and may also include an embodiment in which additional features are formed between the first and second features, in this case, the first and second features may not be in direct contact.

Figure 1:
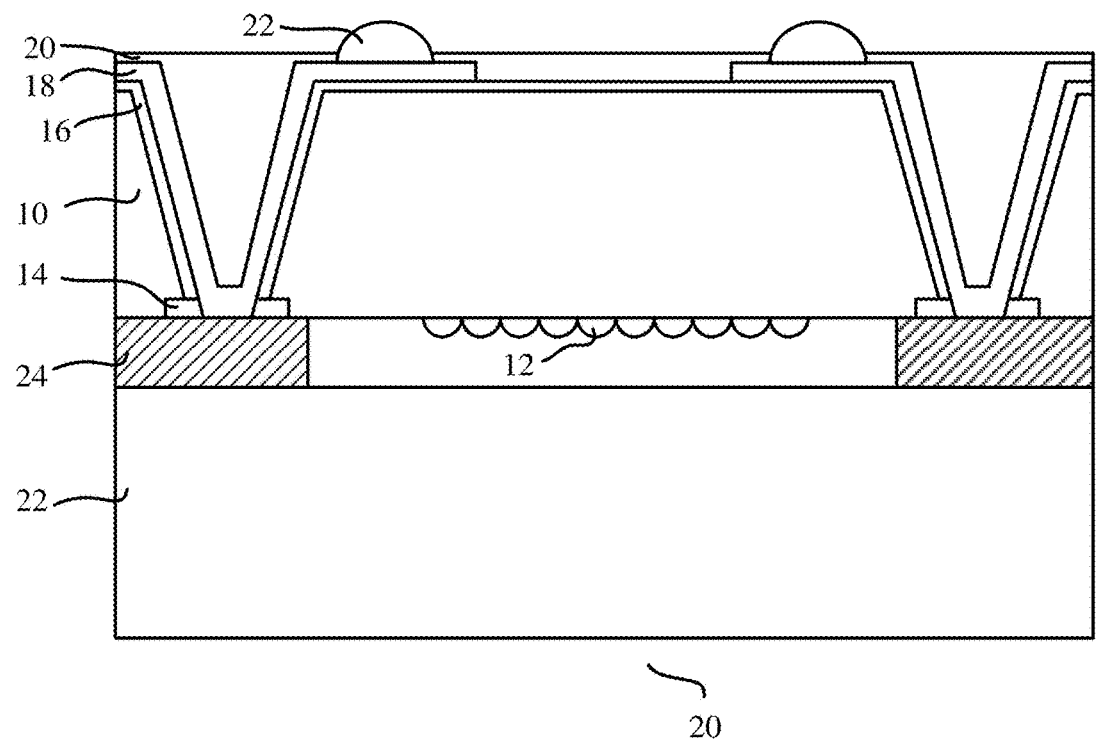
FIG. 1 shows a sectional view illustrating a structure of a package for an image sensing chip according to the conventional technology.
Figure 2:
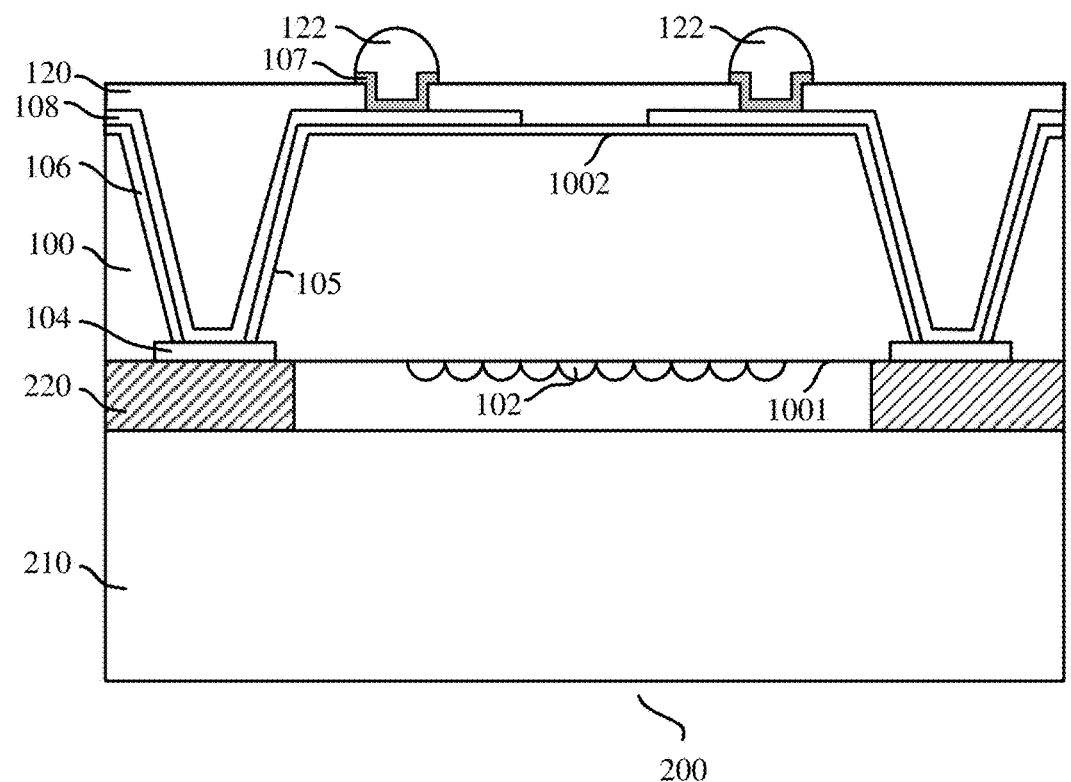
FIG. 2 shows a sectional view illustrating a structure of a package for an image sensing chip according to an embodiment of the present disclosure.
Figure 3:
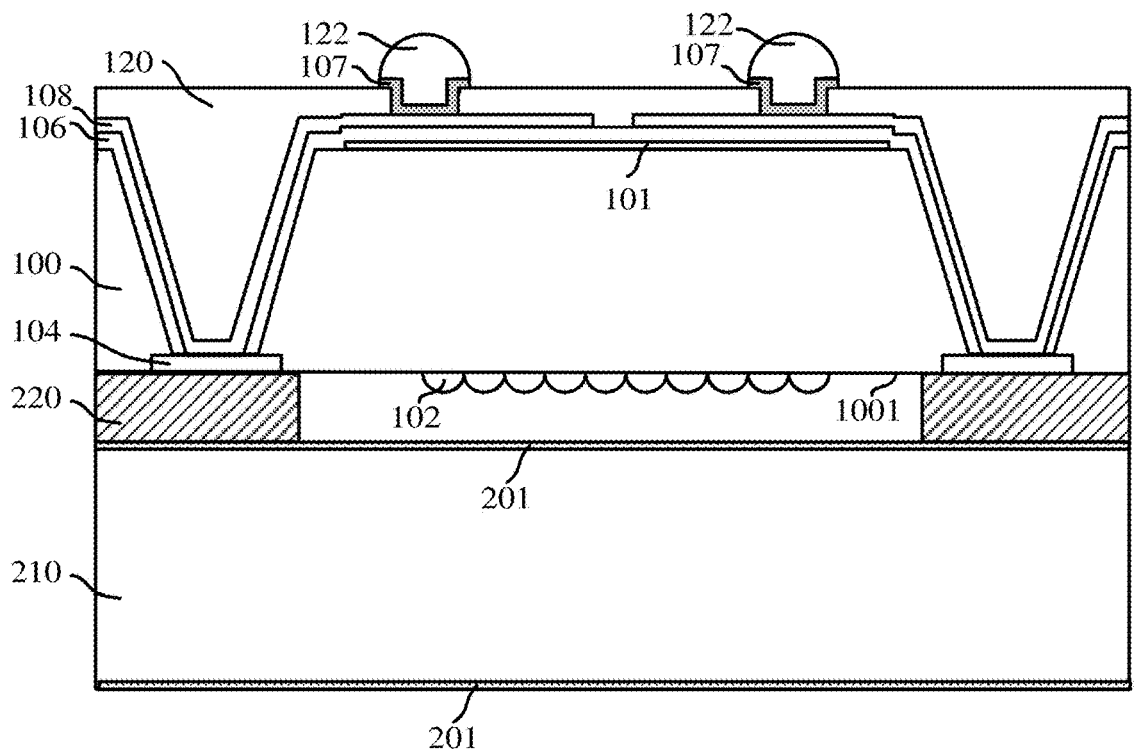
FIG. 3 shows a sectional view illustrating a structure of a package for an image sensing chip according to another embodiment of the present disclosure.

In order to reduce the defects of the image sensing chip, especially the defects of the electrical connection layer, a package for an image sensing chip is provided according to the present disclosure. As shown in FIG. 2 and FIG. 3, the package includes:

an image sensing chip 100 including a first surface 1001 and a second surface 1002 opposite to each other, where the first surface is provided with an image sensing region 102 and a contact pad 104 around the image sensing region;

a through hole 105 extending from the second surface 1002 to the contact pad 104;

an electrical connection layer 108 provided along an inner wall of the through hole 105 and extending onto the second surface 1002, where the electrical connection layer 108 is electrically connected with the contact pad 104;

a solder mask 120 filling the through hole 105 and covering the electrical connection layer 108, where an opening is formed in the solder mask 120, and the electrical connection layer 108 is exposed at a bottom of the opening;

a guide contact pad 107 covering an inner wall and the bottom of the opening and extending onto the solder mask, where the guide contact pad 107 is electrically connected with the electrical connection layer 108; and a solder bump 122 located on the guide contact pad 107, where the solder bump 122 is electrically connected with the guide contact pad 107.

In the present disclosure, the solder bump is not directly arranged on the electrical connection layer. Instead, the guide contact pad is provided between the solder bump and the electrical connection layer, for avoiding thermal shock to the electrical connection layer in a subsequent process for soldering the bump and other tests, thereby protecting the electrical connection layer against defects of virtual connection or even break. In addition, the guide contact pad is formed on the inner wall and the bottom of the opening of the solder mask, as well as on the surface of the solder mask outside the opening. Only the guide contact pad on the bottom of the opening is connected with the electrical connection layer, and the solder bump is electrically connected with the electrical connection layer via the guide contact pad. In this way, the guide contact pad matches with the solder bump, and the electrical connection layer does not need to be provided with an end portion matching with the solder bump at the position where the electrical connection layer is connected with the solder bump, so that the electrical connection layers can be arranged more densely, thereby greatly enhancing the degree of integration of devices, and achieving further miniaturization of the devices.

In the embodiment of the present disclosure, the package for an image sensing chip may be a structure in which the electrical connection layer and the solder bump are formed, and which is not cut, or may be an individual finished chip structure obtained after cutting.

The image sensing chip includes at least the image sensing region and the contact pad. In the embodiments of the present disclosure, the image sensing region 102 and the contact pad 104 around the image sensing region 102 are arranged on the first surface of the image sensing chip. The image sensing region 102 is used for receiving external light and converting the external light into an electrical signal. At least an image sensing chip unit is formed in the image sensing region 102. An association circuit connected with the image sensing chip unit may be further formed in the image sensing region 102. The association circuit may be a driving unit (not shown in the drawings) for driving the chip, a reading unit (not shown in the drawings) for acquiring a photosensitive region current, a processing unit (not shown in the drawings) for processing the photosensitive region current, and the like.

Apparently, other components may also be provided on the image sensing chip according to specific design requirements. However, the components which are not closely related to the inventive aspects of the present disclosure are not described in detail herein.

Generally, in order to facilitate wiring, the image sensing region 102 is located at the center of a single chip unit, contact pads 104 are arranged in a rectangular configuration around the image sensing region 102 and at the periphery of the single chip unit, where several contact pads 104 may be formed on each side of the single chip unit. The contact pad 104 is an input/output terminal between a component in the image sensing region and an external circuit, through which the electrical signal from the image sensing region 102 is transmitted to the external circuit. The contact pad is made of a conductive material, which may be a metal material such as Al, Au, or Cu.

It should be understood that the positions of the image sensing region and the contact pads, as well as the number of the contact pads may be adjusted according to different designs and requirements. For example, the contact pads may be provided on only one side or two sides of the image sensing region.

Preferably, but not necessarily, the package for an image sensing chip may further include a protective cover plate 200 attached and aligned with the image sensing region 102. The protective cover plate 200 is attached and aligned with the first surface 1001 of the image sensing chip 100 for protecting the components in the image sensing region 102. The protective cover plate 200 includes a space for containing the image sensing region, so that a protective cover is formed on the image sensing region, thereby protecting the image sensing region from damage without affecting the light entering the image sensing region. In an embodiment of the present disclosure, the protective cover plate 200 is made of optical glass, on which a support structure 220 is provided. The protective cover plate 200 is attached and aligned with the image sensing region 102 via the support structure 220, so that the image sensing region 102 is contained in a cavity formed by the support structure 220, thereby forming a glass cover for protecting the image sensing region 102. It should be understood that the protective cover plate 200 may have other structures. For example, the protective cover plate 200 may be formed by an opaque substrate, and an opening or a light-transmitting opening with a shield is provided at a region of the substrate corresponding to the image sensing region.

However, the protective cover plate made of the optical glass may have a defect of specular reflection, which causes reduction of the light entering the image sensing region and affects the imaging quality. Therefore, referring to FIG. 3, in an embodiment of the present disclosure, an anti-reflection layer 201 is provided on a surface of the protective cover plate 200 made of optical glass. The anti-reflection layer 201 may be arranged on a surface of the optical glass facing the image sensing region 102 or a surface opposite to the surface facing the image sensing region 102. Alternatively, the anti-reflection layer 201 may be provided on both surfaces of the optical glass. The anti-reflection layer covers at least a region corresponding to the image sensing region 102. A suitable material of the anti-reflection coating may be selected according to the selected optical glass. The reflected light can be reduced, the light entering the image sensing region can be increased, and the imaging quality can be improved by providing the anti-reflection layer on the surface of the optical glass.

In a preferred embodiment of the present disclosure, a light shielding layer 101 may be provided on the second surface 1002. As shown in FIG. 3, the light shielding layer 101 covers the image sensing region 102 for preventing light, especially infrared light, from entering the image sensing region 102 through the chip. The light shielding layer 101 may be made of a metal material, such as aluminum, aluminum alloy or another suitable metal material, so that the light undergoes specular reflection at the surface of the light shielding layer, thereby preventing the light from entering the image sensing region. More preferably, the metal material may be blackened metal Al which also has good light absorption performance.

In the present disclosure, the through hole 105 extending to the contact pad is formed on the second surface. The electrical connection layer 108 electrically connected with the contact pad 104 is formed in the through hole, the guide contact pad 107 electrically connected with the electrical connection layer 108 is provided on the electrical connection layer, and a solder bump 122 electrically connected with the guide contact pad 107 is formed on the guide contact pad, such that an electrical signal from the image sensing region 102 can be transmitted to an external circuit.

The through hole 105 extends through the image sensing chip 100 to the contact pad 104, so that the contact pad 104 is exposed through the through hole 105. The through hole 105 may extend to the surface of the contact pad 104, or may further extend through a part of the thickness of the contact pad 104. The through hole 105 may be in an inverted trapezoid or a stepped shape, that is, the through hole may have an inverted trapezoid cross section or a stepped cross section.

The electrical connection layer 108 covers the inner wall of the through hole 105 and extends onto the second surface 1002 on two sides of the through hole 105 for connection with the solder bump 122. The electrical connection layer is made of a conductive material, which may be a metal material such as Al, Au and Cu.

The guide contact pad 107 is provided on the electrical connection layer 108, and the solder bump 122 is formed on the guide contact pad 107. The guide contact pad 107 is in contact with the electrical connection layer 108, and may have a shape substantially similar to a shape of the solder bump, such as a circular shape, for facilitating soldering a bump thereon. An area of the guide contact pad 107 may be substantially the same as or slightly greater than an area of a lower surface of the solder bump. Instead of directly providing the solder bump on the electrical connection layer, the guide contact pad is formed between the solder bump and the electrical connection layer for avoiding thermal shock to the electrical connection layer in a subsequent process for soldering the bump and other tests, thereby protecting the electrical connection layer against defects of virtual connection or even break.

In an embodiment of the present disclosure, as shown in FIG. 2, the solder mask 120 fills the through hole and covers the electrical connection layer 108. The guide contact pad 107 is formed in an opening of the solder mask 120 on the second surface 1002. The guide contact pad 107 is provided along the inner wall and on the bottom of the opening and extends on to the solder mask on two sides of the opening. The solder bump 122 is formed in the opening and is located on the guide contact pad 107. In this way, the guide contact pad 107 is connected with the electrical connection layer 108 only at the bottom of the opening, and the solder bump 122 is electrically connected with the electrical connection layer 108 via the guide contact pad 107. In this way, a pattern of the guide contact pad 107 matches with the solder bump 122, and the electrical connection layer 108 does not need to be provided with an end portion matching with the solder bump at the position where the electrical connection layer 108 is connected with the solder bump 122, so that the electrical connection layers can be arranged more densely, thereby greatly enhancing the degree of integration of devices, and achieving further miniaturization of the devices.

The guide contact pad 107 is made of a conductive material, which may be a metal material, such as Al, Au, and Cu. The solder bump is used for electrical connection with an external circuit. The solder bump 122 may be a connection structure such as a solder ball and a metal pillar, and may be made of a metal material such as copper, aluminum, gold, tin, and lead.

In an embodiment of the present disclosure, an electrical insulation layer 106 is provided between the electrical connection layer 108 and the image sensing chip 100. Referring to FIG. 2, the electrical insulation layer 106 is formed on a side wall of the through hole 105 and the second surface on two sides of the through hole. The electrical insulation layer is made of a dielectric material, such as silicon oxide, silicon nitride, silicon oxynitride or an organic dielectric material, and is used for electrical isolation. In a preferred embodiment, the electrical insulation layer 106 is a passivation layer. The passivation layer is made of a dielectric material of oxide or nitride, such as silicon oxide, silicon nitride, silicon oxynitride or a stack thereof. As the electrical insulation layer for the electrical connection layer, the passivation layer has good step coverage. Moreover, the passivation layer has a small expansion coefficient, so that a compression force received by the electrical connection layer due to the thermal expansion is greatly reduced, thereby further reducing the defects of the electrical connection layer of the image sensing chip.

The Solder mask functions as an insulation and protection layer for other layers in the process of soldering the bump. The solder mask may preferably be made of photosensitive solder mask ink, and functions as a buffer layer while providing insulation and protection, for absorbing an impact force caused by reflow soldering to the passivation layer in the process of soldering the bump.

The embodiments of the package for an image sensing chip of the present disclosure are described in detail above. In addition, a packaging method for the above-described package is further provided according to the present disclosure. The packaging method is described in detail below in conjunction with specific embodiments.

Figure 4:
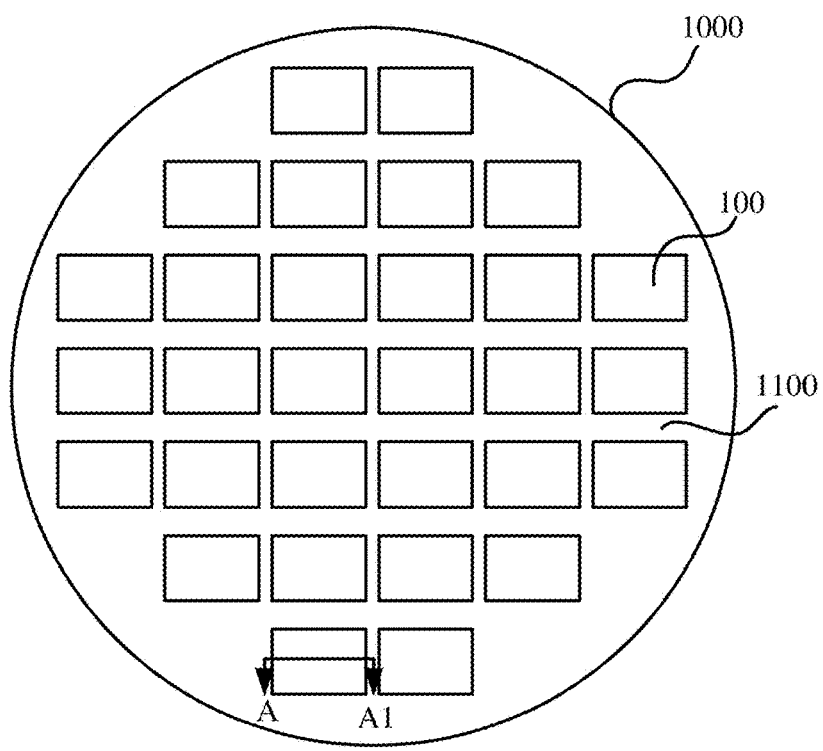
FIGS. 4 to 15 show schematic structural diagrams of intermediate structures formed during implementation of a packaging method for an image sensing chip according to an embodiment of the present disclosure.
Figure 5:
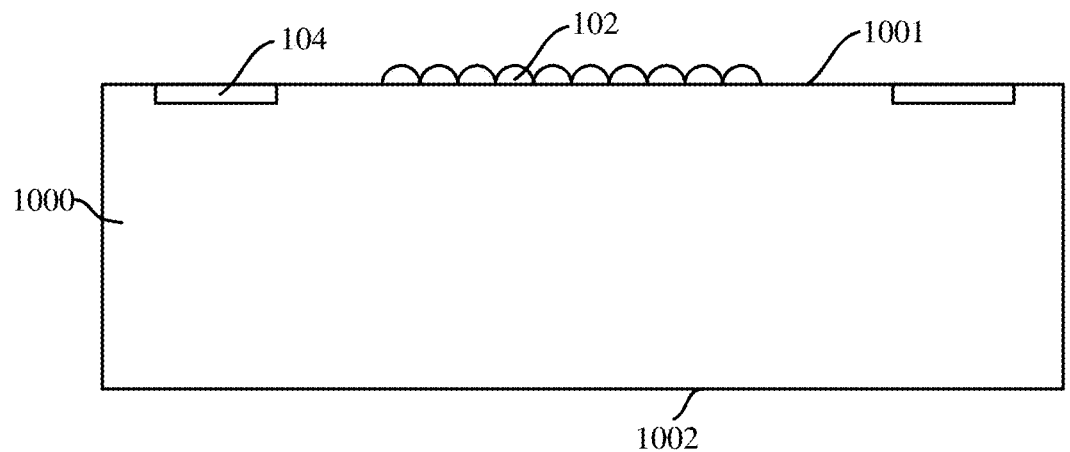

First, in step S101, a wafer 1000 is provided. The wafer 1000 includes multiple image sensing chips 100 arranged in an array. In an embodiment of the present disclosure, as shown in FIG. 4, multiple image sensing chips 100 are formed on the wafer 1000, and are arranged in an array. Cutting trench regions 1100 are provided between adjacent image sensing chips 100 for cutting the wafer 1000 in a subsequent process to form independent image sensing chip packages. Referring to FIG. 5, the wafer 1000 includes a first surface 1001 and a second surface 1002 opposite to each other. The image sensing chip 100 is provided with an image sensing region 102 and a contact pad 104 around the image sensing region. The image sensing region 102 and the contact pad 104 are located on the first surface 1001. FIG. 4 is a plan view illustrating a structure of the wafer 1000. FIG. 5 and subsequent related drawings are cross-sectional views illustrating a structure of the image sensing chip 100 along AA1.

In the present embodiment, the wafer 1000 is a semiconductor substrate, which may be a bulk substrate or a stacked substrate including a semiconductor material, such as a Si substrate, a Ge substrate, a SiGe substrate, or an SOI substrate.

In an embodiment of the present disclosure, the image sensing chip includes the image sensing region 102 and the contact pad 104 around the image sensing region. The image sensing region 102 and the contact pad 104 are located on the first surface 1002. The image sensing region 102 is used for receiving external light and converting the external light into an electrical signal. At least an image sensor unit is formed in the image sensing region 102. The image sensor unit may be formed by multiple photodiodes arranged in an array, for example. An association circuit connected with the image sensor unit may be further formed in the image sensing region 102. The association circuit may be a driving unit (not shown in the drawings) for driving the chip, a reading unit (not shown in the drawings) for acquiring a photosensitive region current, a processing unit (not shown in the drawings) for processing the photosensitive region current, and the like.

Preferably, but not necessarily, the packaging method may further include step S102. In step S102, a protective cover plate 200 is provided, and is attached and aligned with the wafer 1000, as shown in FIGS. 6 to 7.

Figure 6:
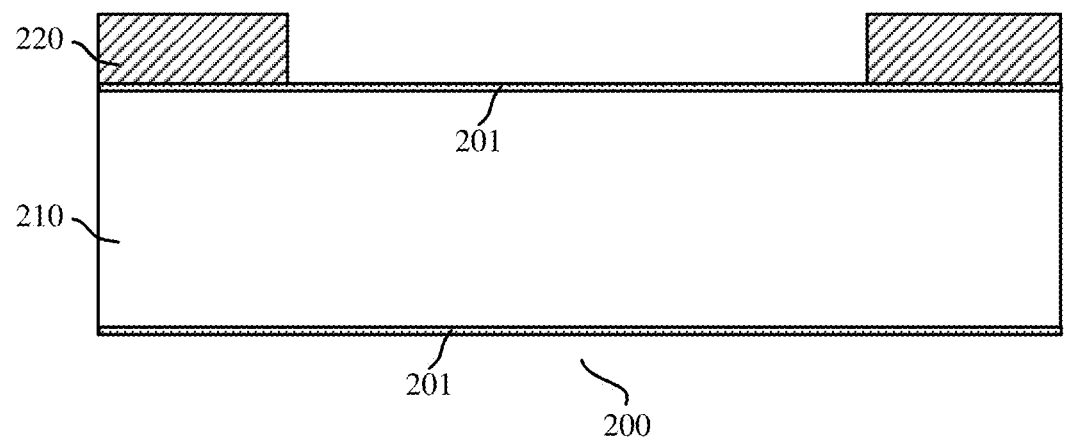
Figure 7:
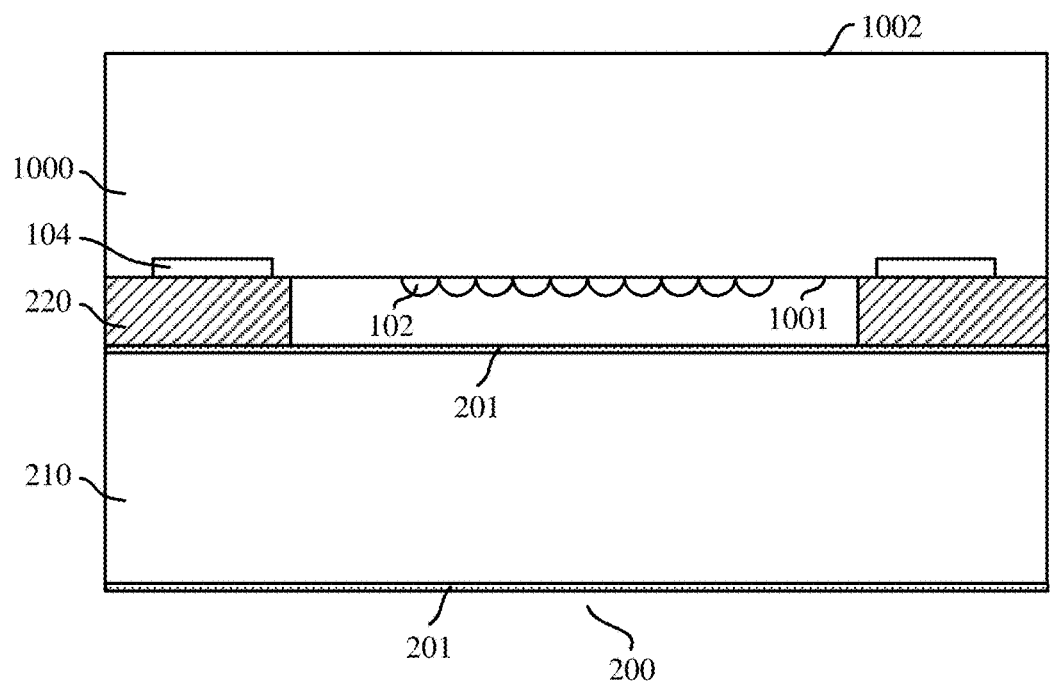

In this embodiment, as shown in FIG. 6, the protective cover plate 200 is made of optical glass on which a support structure 220 is provided. The protective cover plate 200 is attached and aligned with the image sensing region 102 via the support structure 220, so that the image sensing region 102 in contained in a cavity formed by the support structures 220, thereby forming a glass cover for protecting the image sensing region 102. The optical glass may be inorganic glass, organic glass or another transparent material with certain strength. A thickness of the optical glass may range from 300 µm to 500 µm.

The support structure 220 is usually made of a dielectric material, such as silicon oxide, silicon nitride, silicon oxynitride, or a photoresist. In a specific embodiment, the support structure is made of a photoresist. First, the photoresist may be spin-coated on a surface of the optical glass and then exposed and developed to form the support structure 220 on the photosensitive glass.

The protective cover plate made of the optical glass may have a defect of specular reflection, which causes reduction of the light entering the image sensing region and affects the imaging quality. Therefore, referring to FIG. 6, an anti-reflection layer 201 is provided on a surface of the optical glass before the support structure is formed. The anti-reflection layer 201 may be provided on a surface of the optical glass facing the image sensing region 102 or a surface opposite to the surface facing the image sensing region 102. Alternatively, the anti-reflection layer 201 may be provided on both surfaces of the optical glass. The anti-reflection layer may be formed on the glass substrate by a spraying process. The anti-reflection layer covers at least a region corresponding to the image sensing region 102. A suitable material of the anti-reflection coating may be selected according to the selected optical glass.

In this embodiment, as shown in FIG. 7, the protective cover plate 200 is attached with the first surface of the wafer 1000 via the support structure 220, where the protective cover plate 200 is attached and aligned with the image sensing region 102. Here, an adhesive layer (not shown in the drawings) may be provided on the support structure 220 and/or the first surface of the wafer 1000 for attaching and aligning the protective cover plate 200 with the wafer 1000. For example, the adhesive layer may be provided on the surface of the support structure 220 and/or at a position on the first surface of the wafer 1000 corresponding to the support structure 220 by a spraying process, a spin-coating process or an adhesion process. Then the support structure 220 and the wafer 1000 are pressed, such that the support structure 220 and the wafer 1000 are attached with each other by the adhesive layer. The adhesive layer performs an adhesive function, as well as an insulation function and a sealing function. The adhesive layer may be made of a polymeric adhesive material, which may be a polymeric material such as silica gel, epoxy resin, or benzocyclobutene.

Figure 9:
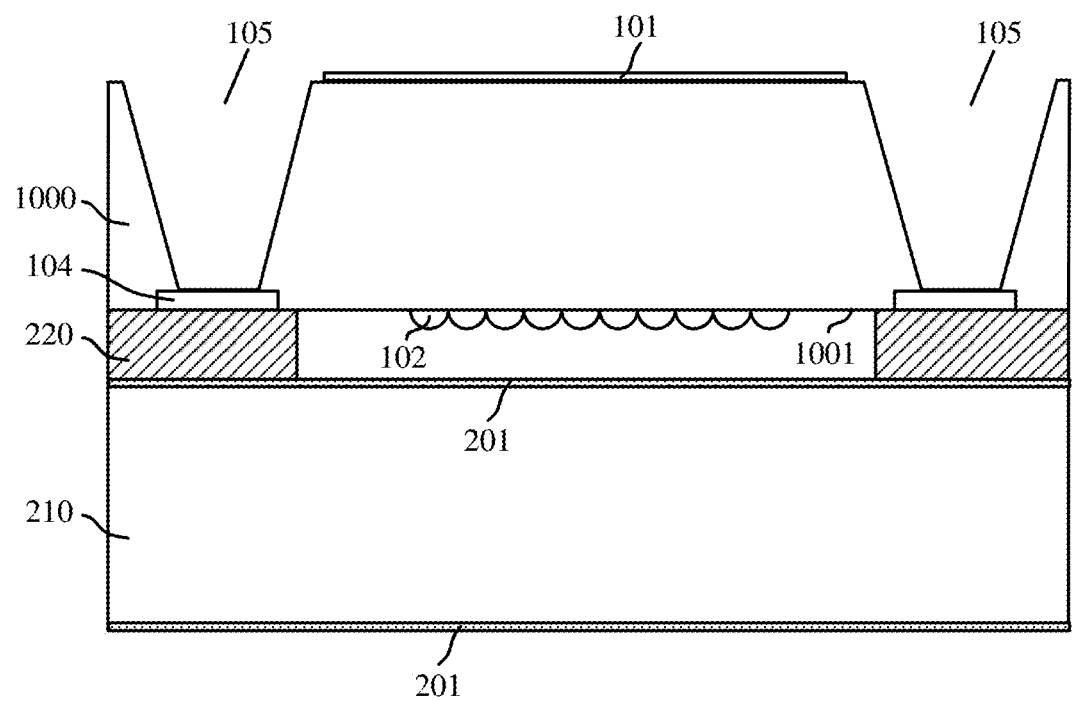

Then, in step S103, a through hole 105 extending to the contact pad 104 is formed on the second surface 1002, as shown in FIG. 9.

Before performing step S103, the wafer 1000 is thinned from the second surface 1002 to facilitate subsequent etching for forming the through hole. The wafer 1000 may be thinned by a mechanical chemical polishing process, a chemical mechanical polishing process or a combination thereof.

Figure 8:
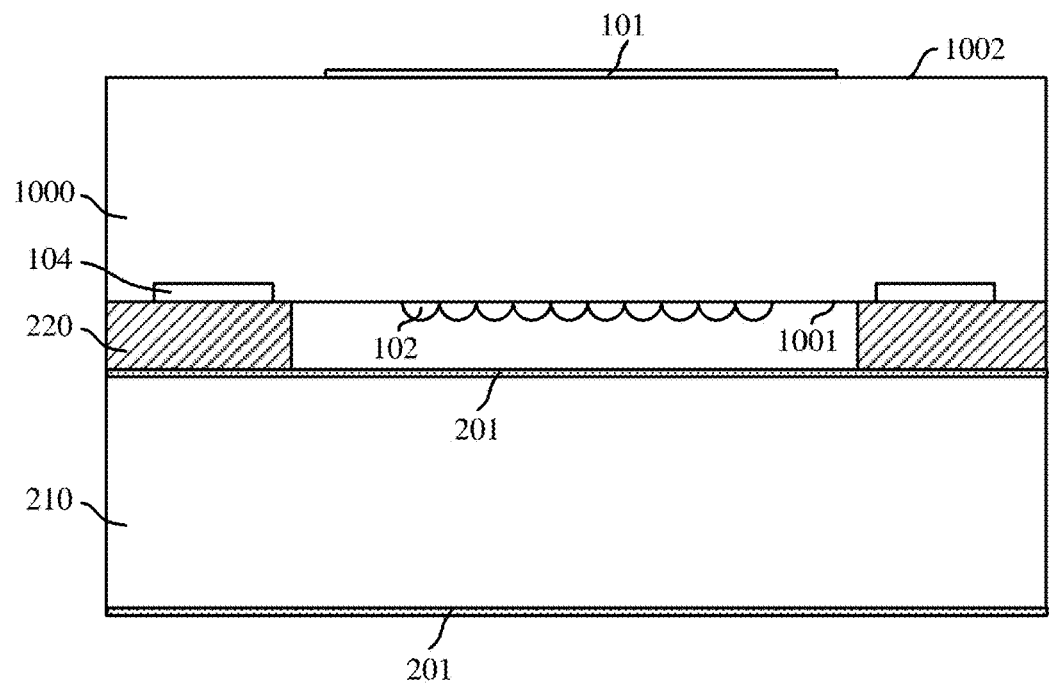

After that, more preferably, a light shielding layer 101 may be provided at least on a region of the second surface corresponding to the image sensing region 102 in order to avoid or reduce light, especially infrared light, entering the image sensing region 102 through the second surface, as shown in FIG. 8. The light shielding layer 101 may be made of a metal material, which may be, for example, aluminum, aluminum alloy or another suitable metal material. In a preferred embodiment, first, a metal layer, such as an aluminum metal layer, may be formed on the second surface of the wafer 1000 by a sputtering process; next, the metal layer is blacked, to form and a black sulfide film layer on the aluminum metal layer, for improving the light shielding effect of the aluminum material layer. The metal layer may be blackened using an acid solution or an alkali solution. For example, the aluminum metal layer may be treated with an alkali solution containing sulfur. The thickness of the blackened metal layer may range from 1 µm to 10 µm. Preferably, the thickness may be 5 µm, 6 µm and the like. Then, the metal material layer is patterned to form the light shielding layer 101 only on a region of the second surface corresponding to the image sensing region 102. The light shielding layer may also have an area greater than that of the image sensing region 102 to completely cover the image sensing region, thereby achieving better light shielding effect.

Then, a through hole 105 extending to the contact pad 104 is formed on the second surface 1002, as shown in FIG. 9. Specifically, the wafer 1000 may be etched using an etching technique, such as the reactive ion etching technique or the inductively coupled plasma etching technique, until the contact pad 104 is exposed, and the contact pad 104 may be further over etched, i.e., a part of the thickness of the contact pad may be removed by etching, to form the through hole 105 through which the contact pad is exposed.

Figure 10:
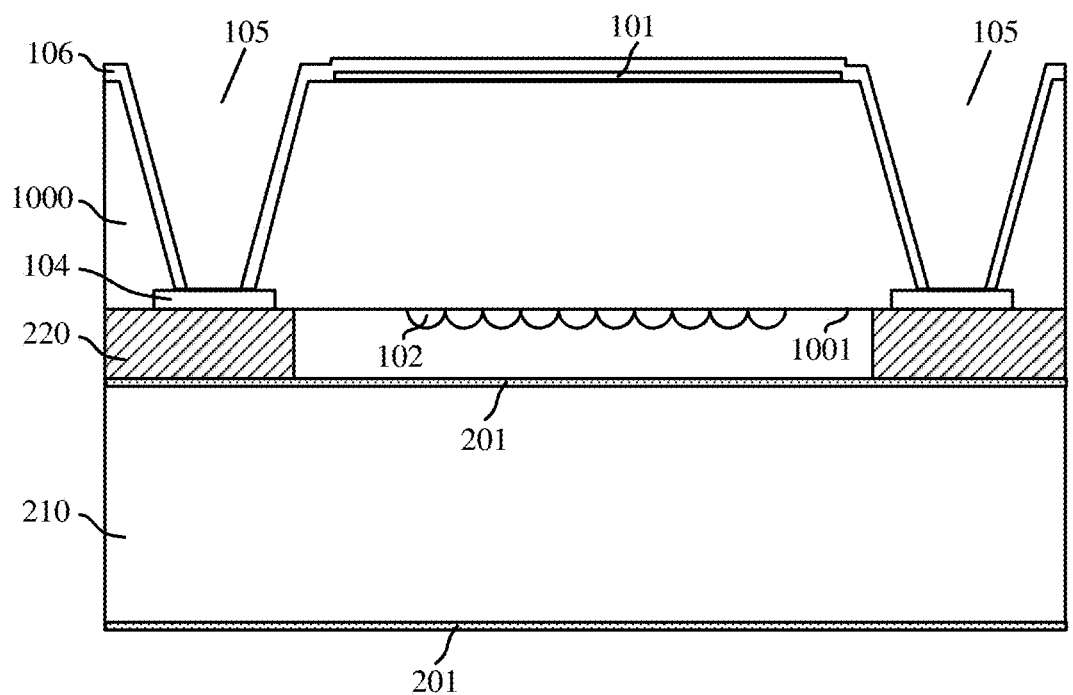

Preferably, but not necessarily, the passivation layer as the electrical insulation layer 106 may further be formed on the side wall of the through hole 105 and the second surface 1002 on two sides of the through hole 105, as shown in FIG. 10. The passivation layer 106 may be made of a dielectric material of oxide or nitride, such as silicon oxide, silicon nitride, silicon oxynitride or a stack layer thereof. Specifically, first, a passivation material layer such as a silicon oxide layer is deposited using a chemical vapor deposition method. Next, a masking process is performed, where etching is performed with the passivation material layer being masked by a mask, to remove the passivation material layer on the contact pad 104, so that the passivation layer 106 is formed on only the side wall of the through hole 105 and the second surface 1002 on two sides of the through hole 105. The electrical insulation layer formed by the passivation layer has better coverage. Moreover, the passivation layer on the contact pad may be selectively removed using an etching process, thereby achieving a surface to surface contact between the electrical connection layer which is formed subsequently and the contact pad, thus a better contact and binding between the electrical connection layer and the contact pad can be ensured.

Figure 11:
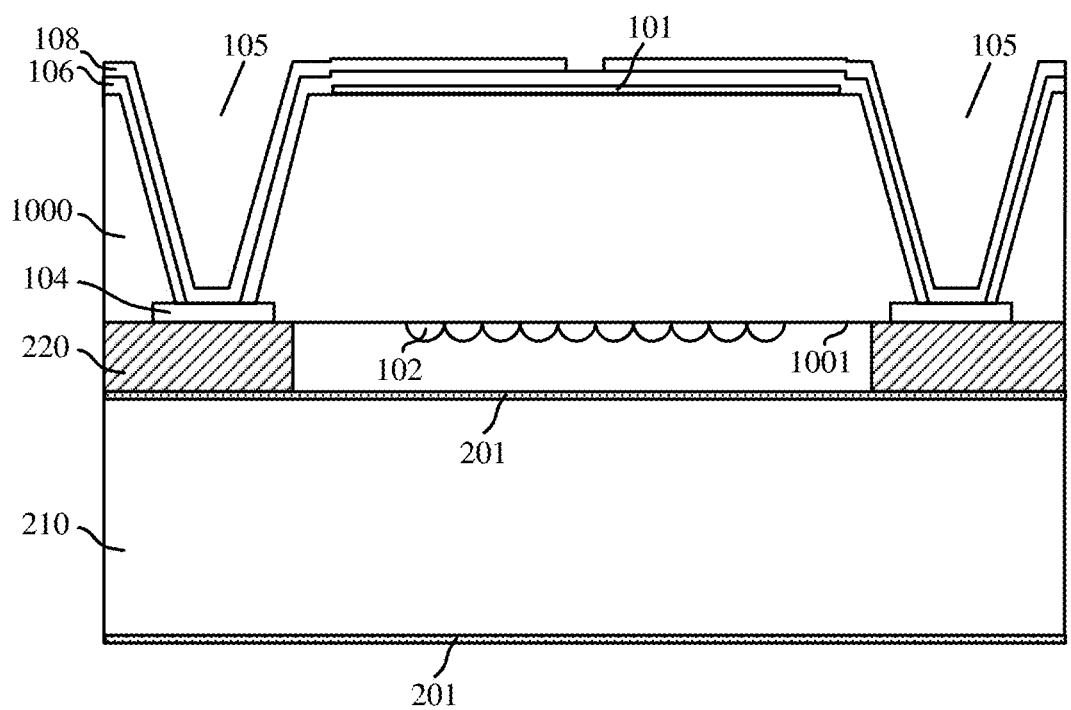

Next, in step S104, an electrical connection layer 108 is formed on an inner wall of the through hole 105 and the second surface, as shown in FIG. 11.

The electrical connection layer is made of a conductive material, which may be a thin film of a metal material, such as Al, Au, Cu or the like. The electrical connection layer may be formed by a RDL (Redistribution Layer) technology or other suitable deposition process. For example, electroplating of Cu is performed using the RDL technology and Ti is sputtered for forming a prim layer, to form the electrical connection layer 108. With the RDL technology, the layout of the bonding area is rearranged, thereby better meeting the requirements on the minimum pitch of the solder bumps in the bonding area.

Figure 15:
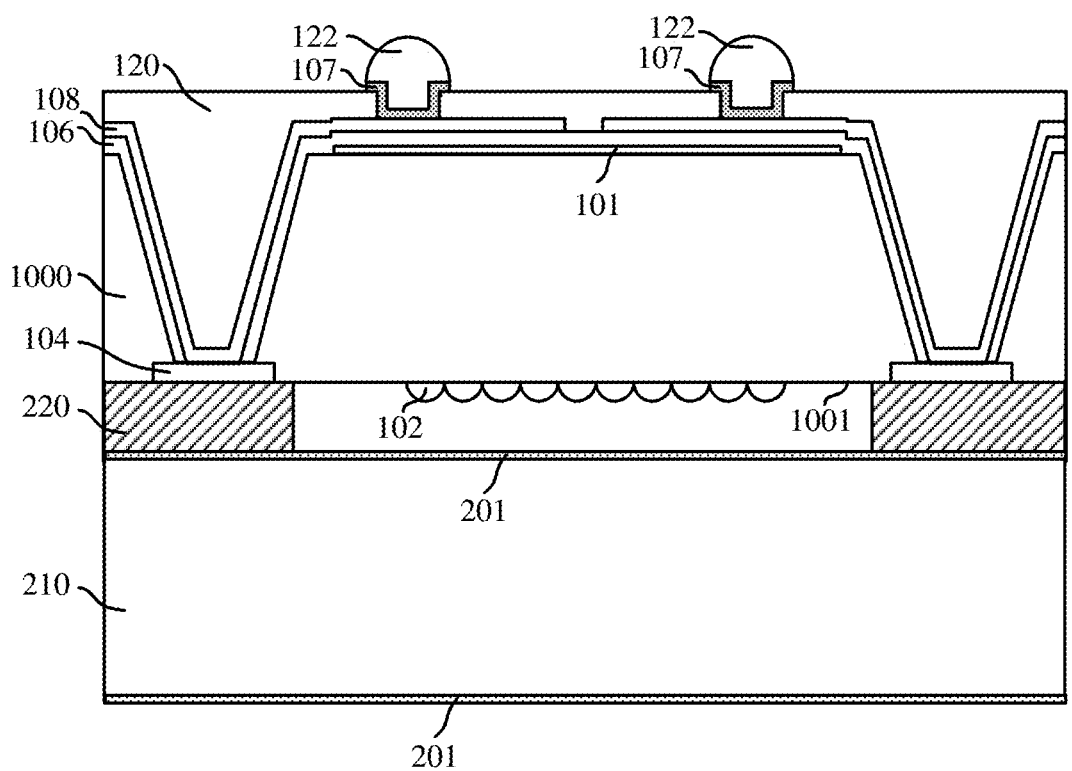

Then, in step S105, a guide contact pad 107 and a solder bump 122 are formed, as shown in FIG. 15.

Figure 12:
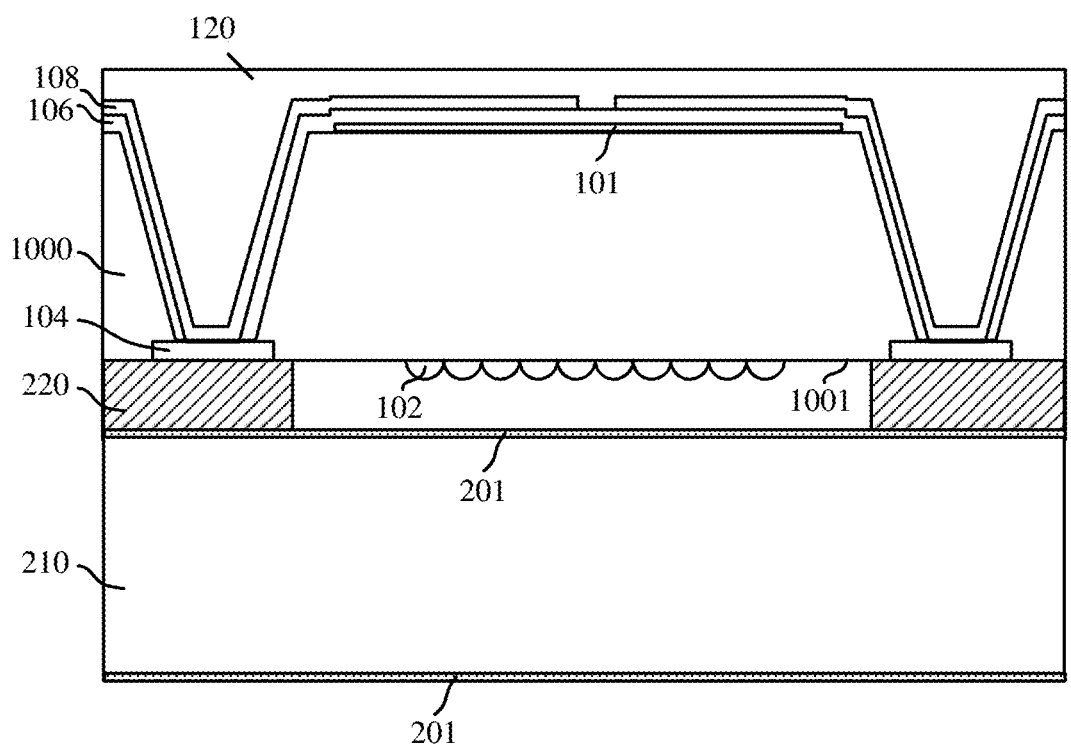
Figure 13:
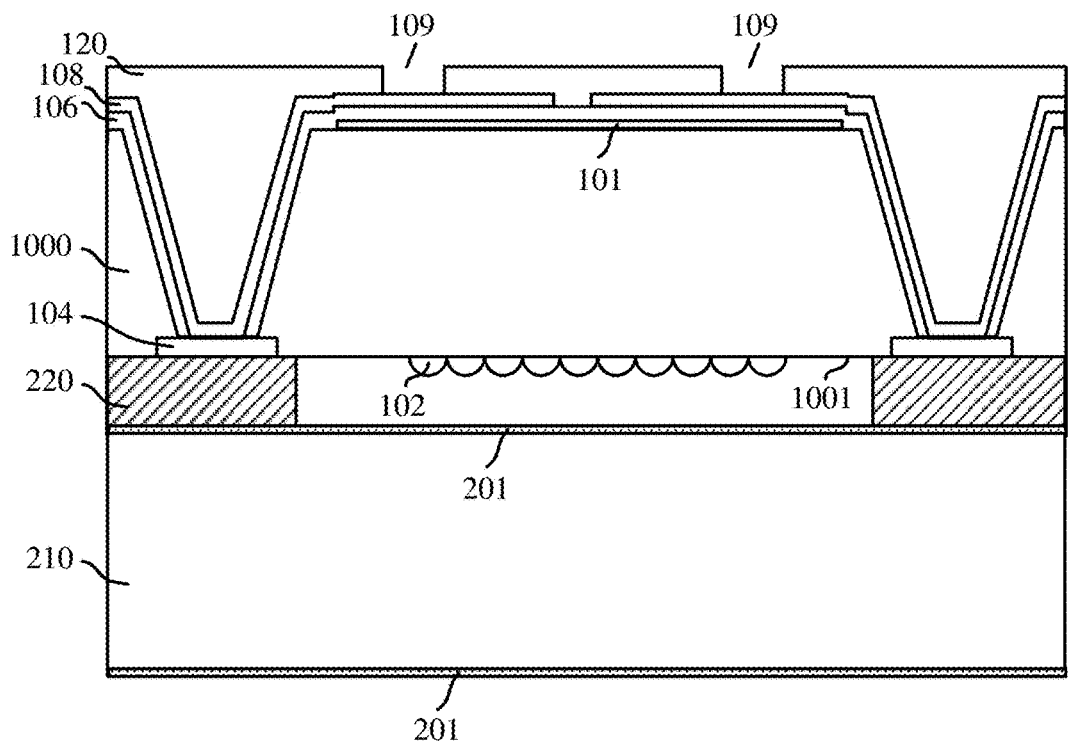

In this embodiment, specifically, first, the solder mask 120 which fills the through hole 105 and covers the electrical connection layer 108 is formed, as shown in FIG. 12. The solder mask 120 functions as an insulation and protection layer for other layers in the process of soldering the bump. The solder mask may be made of, for example, photosensitive solder mask ink. The solder mask 120 filling the through hole 105 and covering the electrical connection layer 108 may be formed by a spin coating process, as shown in FIG. 12. Next, an opening 109 is formed in the solder mask 120, where the electrical connection layer 108 on the second surface 1002 is exposed at the bottom of the opening 109, as shown in FIG. 13. The opening in solder mask 120 on the electrical connection layer 108 is formed by exposure and development, where the electrical connection layer 108 is exposed at the bottom of the opening 109.

In the embodiment of the present disclosure, a pattern corresponding to the bonding area or a pattern smaller than the bonding area may not be formed on a region of the electrical connection layer corresponding to the bonding area. The guide contact pad is in contact with the electrical connection layer to form an electrical connection, and a pattern of the bonding area is further formed on the guide contact pad, so that the electrical connection layers may be arranged more densely, thereby greatly enhancing the degree of integration of devices, and achieving further miniaturization of the devices.

Figure 14:
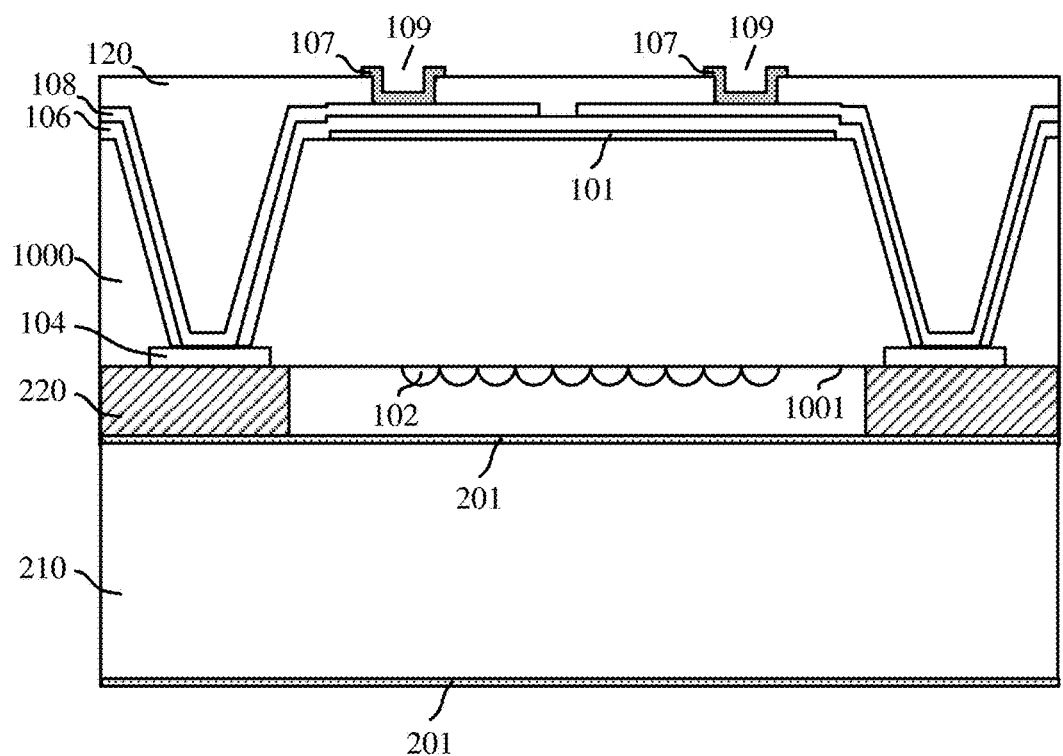

Then, a guide contact pad 107 is formed on the inner wall and the bottom of the opening 109, and on the surface of the solder mask 120 outside the opening, as shown in FIG. 14. The guide contact pad is made of a conductive material, which may be a thin film of a metal material, such as Al, Au, and Cu, and may be formed by the RDL (Redistribution Layer) technology or other suitable deposition process. For example, electroplating of Cu is performed using the RDL technology, and Ti is sputtered for forming a prim layer to form the guide contact pad 107. With the RDL technology, the layout of the bonding area is rearranged, thereby better meeting the requirements of the bonding area on the minimum pitch of the solder bumps.

Finally, a solder bump 122 is formed on the guide contact pad 107, as shown in FIG. 15. A UBM (Under Bump Metal) layer may be formed first. Then, a bumping process is performed, where a solder ball is placed on the UBM through a reticle. Next, a reflow soldering process is performed, to form the solder bump 122 in the opening. The solder bump may be a connection structure such as a solder ball, or a metal pillar, and may be made of a metal material such as copper, aluminum, gold, tin or lead or alloy material thereof.

At this point, the package according to the embodiment of the present disclosure is formed. Further, a cutting process may be performed to cut the above-mentioned package into separate chips along the cutting trench regions to obtain independent chip packages.

The present disclosure is disclosed above, but is not limited thereto. Various alternations and modifications can be made to the technical solutions of the present disclosure by those skilled in the art without deviation from the spirit and scope of the present disclosure. Therefore, the scope of protection of the present disclosure is defined by the appended claims.

The invention claimed is:

1. A package for an image sensing chip, comprising:
   an image sensing chip comprising a first surface and a second surface opposite to each other, wherein the first surface is provided with an image sensing region and a contact pad around the image sensing region;
   a light shielding layer located on the second surface and covering the image sensing region;
   a through hole extending from the second surface to the contact pad;
   an electrical connection layer provided along an inner wall of the through hole and extending onto the second surface, wherein the electrical connection layer is electrically connected with the contact pad;
   a solder mask filling the through hole and covering the electrical connection layer, wherein an opening is formed in the solder mask, and the electrical connection layer is exposed at a bottom of the opening;
   a guide contact pad covering an inner wall and the bottom of the opening and extending onto the solder mask, wherein the guide contact pad is electrically connected with the electrical connection layer and extends onto an outer surface of the package for the image sensing chip; and
   a solder bump located on the guide contact pad, wherein the solder bump is electrically connected with the guide contact pad.

2. The package according to claim 1, wherein the guide contact pad has a circular shape.

3. The package according to claim 1, further comprising a passivation layer located between the electrical connection layer and a side wall of the through hole, and on the second surface.

4. The package according to claim 3, wherein the solder mask is made of photosensitive solder mask ink.

5. The package according to claim 1, further comprising:
   a protective cover plate attached and aligned with the image sensing region of the image sensing chip, wherein the protective cover plate is attached and aligned with the first surface of the image sensing chip.

6. The package according to claim 5, wherein the protective cover plate is made of optical glass, wherein at least one surface of the optical glass is provided with an anti-reflection layer.

7. A packaging method for an image sensing chip, comprising:
   providing a wafer comprising a plurality of image sensing chips arranged in an array, wherein each of the plurality of image sensing chips comprises a first surface and a second surface opposite to each other, and the first surface of the image sensing chip is provided with an image sensing region and a contact pad around the image sensing region;

forming a light shielding layer at a position on the second surface corresponding to the image sensing region;

forming a through hole on the second surface, wherein the through hole extends to the contact pad;

forming an electrical connection layer on an inner wall of the through hole and on the second surface, wherein the electrical connection layer is electrically connected with the contact pad;

forming a solder mask filling the through hole and covering the electrical connection layer, wherein an opening is formed in the solder mask, and the electrical connection layer is exposed at a bottom of the opening;

forming a guide contact pad in the opening, wherein the guide contact pad covers an inner wall and the bottom of the opening and extends onto the solder mask, and is electrically connected with the electrical connection layer and extends onto an outer surface of the package for the image sensing chip; and forming a solder bump on the guide contact pad, wherein the solder bump is electrically connected with the guide contact pad.

8. The packaging method according to claim 7, wherein from the forming the solder mask to the forming the solder bump, the packaging method comprise:

forming the solder mask filling the through hole and covering the electrical connection layer;

forming the opening in the solder mask, wherein the electrical connection layer on the second surface is exposed through the opening;

forming the guide contact pad on the inner wall of the opening and on the solder mask outside the opening; and forming the solder bump on the guide contact pad.

9. The packaging method according to claim 7, wherein after the forming the though hole and before the forming the electrical connection layer, the packaging method further comprises:

forming a passivation layer on a side wall of the through hole and on the second surface.

10. The packaging method according to claim 9, wherein the forming the passivation layer comprises:

depositing the passivation layer; and removing the passivation layer at a bottom of the through hole by etching.

11. The packaging method according to claim 7, further comprising:

providing protective cover plates, and attaching and aligning each of the protective cover plates with the image sensing region of one of the plurality of image sensing chips, wherein the protective cover plate is attached and aligned with the first surface of the image sensing chip.

12. The packaging method according to claim 11, wherein the protective cover plates are optical glass, and at least one surface of the optical glass is provided with an anti-reflection layer.

* * * * *